US006760897B2

(12) United States Patent
Arakawa et al.

(10) Patent No.: US 6,760,897 B2
(45) Date of Patent: Jul. 6, 2004

(54) METHOD AND APPARATUS FOR AUTOMATIC WIRING DESIGN BETWEEN BLOCK CIRCUITS OF INTEGRATED CIRCUIT

(75) Inventors: Toshio Arakawa, Kawasaki (JP); Daisuke Miura, Kawasaki (JP); Masayuki Okamoto, Kawasaki (JP); Mitsuaki Nagasaka, Kawasaki (JP); Hiroyuki Honda, Kawasaki (JP); Shuji Yoshida, Kawasaki (JP); Kenji Kobayashi, Nagoya (JP); Kenji Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/209,927

(22) Filed: Aug. 2, 2002

(65) Prior Publication Data

US 2003/0054619 A1 Mar. 20, 2003

(30) Foreign Application Priority Data

Aug. 22, 2001 (JP) ........................................ 2001-250924

(51) Int. Cl.⁷ ............................................. G06F 17/50
(52) U.S. Cl. .............................. 716/13; 716/12; 716/14
(58) Field of Search ................................. 716/13, 1–12, 716/14; 438/129, 584; 257/204, 207, 777

(56) References Cited

U.S. PATENT DOCUMENTS

| | | | | |
|---|---|---|---|---|
| 5,648,910 A | * | 7/1997 | Ito | 716/2 |
| 6,281,529 B1 | * | 8/2001 | Watanabe | 257/204 |
| 6,492,736 B1 | * | 12/2002 | Chan et al. | 257/773 |
| 6,496,968 B1 | * | 12/2002 | Yamada et al. | 716/12 |
| 6,504,187 B1 | * | 1/2003 | Furuichi | 257/207 |
| 2002/0038448 A1 | * | 3/2002 | Ichimiya et al. | 716/8 |
| 2002/0095643 A1 | * | 7/2002 | Shiratori | 716/2 |
| 2002/0127782 A1 | * | 9/2002 | Fukui et al. | 438/129 |
| 2002/0149116 A1 | * | 10/2002 | Kusumoto | 257/777 |

* cited by examiner

Primary Examiner—Vuthe Siek
Assistant Examiner—Magid Y. Dimyan
(74) Attorney, Agent, or Firm—Staas & Halsey LLP

(57) ABSTRACT

Disclosed is a method for automatic wiring design between block circuits of an integrated circuit, which performs an automatic connection between an inter-block wire disposed between a first circuit block and a second circuit block, and terminals formed along sides of the first and second blocks, the sides facing each other. The method comprises the steps of (S2) sorting the terminals according to the width thereof; and (S3~S11) selecting a terminal from the terminals in descending order of the width, and connecting between the selected terminal and an inter-block wire belonging to a same net as the terminal. In another embodiment, the method comprises the steps of (a) sorting the terminals, connected to a power supply wire, according to the value of electric current passing through the terminals; and (b) selecting a terminal from the terminals in descending order of the value of electric current and connecting between the selected terminal and an inter-block wire belonging to a same net as the selected terminal.

11 Claims, 15 Drawing Sheets

FIG.4
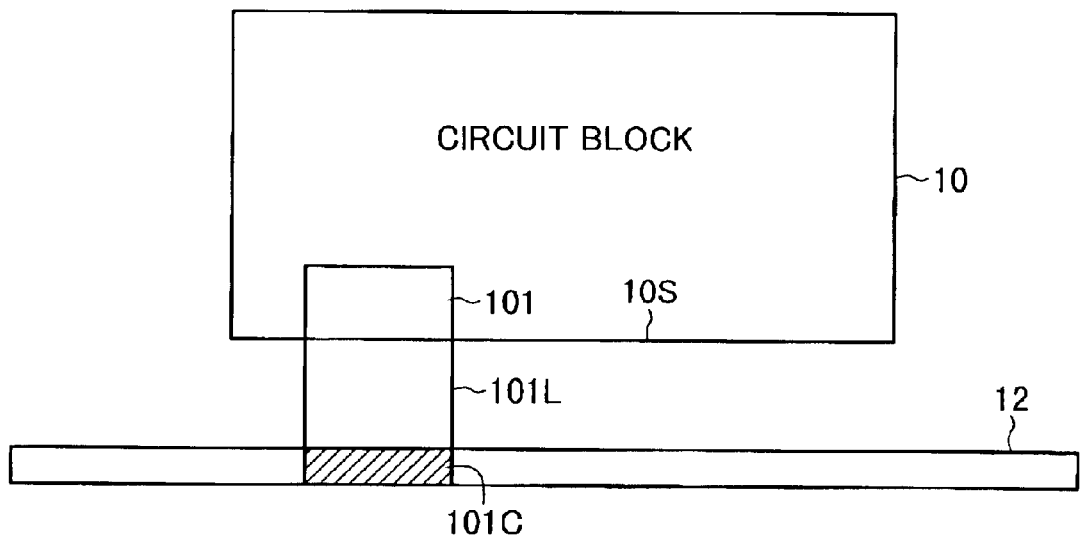
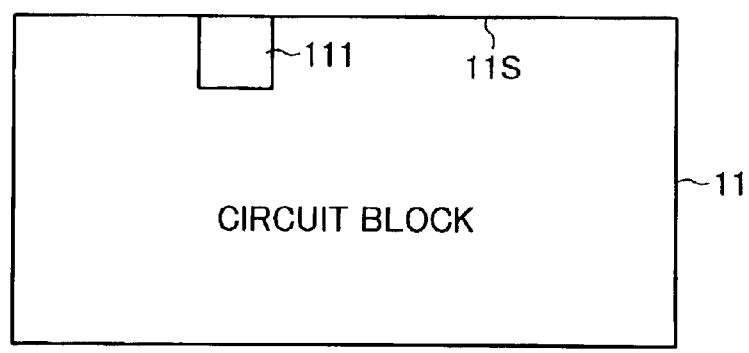

METHOD AND APPARATUS FOR AUTOMATIC WIRING DESIGN BETWEEN BLOCK CIRCUITS OF INTEGRATED CIRCUIT

BACKGROUND OF THE INVENTION

1. Field of the Invention

The present invention relates to a method and an apparatus for automatic wiring design between block circuits of an integrated circuit and a program for performing the same method.

2. Description of the Related Art

As the latest semiconductor integration circuit becomes to have higher integration density and larger scale, the number of wires increases and also a demand arises for much narrower wire region and much higher integration density thereof.

FIG. 12 is a view for illustrating a conventional method for automatic wiring design between block circuits of an integrated circuit.

As shown in this figure, inter-block wires 12 and 13 are disposed between circuit blocks 10 and 11, terminals 101 and 102 are formed along a side 10S of the circuit block 10 which faces the circuit block 11, and terminals 111 and 112 are formed along a side 11S of the circuit block 11 which faces the circuit block 10. A contact hole 101C is formed at a cross portion between the inter-block wire 12 and a wire 101L extended from the terminal 101, and is connected to the wire 101L. Similarly, a contact hole 112C is formed at a cross portion between the inter-block wire 12 and a wire 112L extended from the terminal 112, and is connected to the wire 112L. Through these contact holes 101C and 102C, the block wire 12 is connected to the wires 101L and 112L belonging to upper or lower wire layers, respectively. The terminal 101, the wire 101L, the contact hole 101C, the inter-block wire 12, the contact hole 112C, the wire 112L and the terminal 112 belong to a same net.

In a case where the terminal 102, the inter-block wire 13 and the terminal 111 belong to a same net, the terminal 111 and the inter-block wire 13 can be connected to each other as shown in this figure, but the terminal 102 and the inter-block wire 13 cannot be connected to each other. Wiring layout processes has already been performed for the inside of the circuit blocks 10 and 11, and the block information in the inter-block wiring is given only about the frame and the terminal of the block, and therefore wire extension from the terminal to the internal of the block is forbidden in the inter-block wiring.

Thus, the prior art employs a method as shown in FIG. 13 where interval between the circuit blocks 10 and 11 is made widened; a wire 102L is extended and bent from the terminal 102; a contact hole 102C is formed at a cross portion between the wire 102L and the inter-block wire 13; and the wire 102L and the inter-block wire 13 are connected to each other through the contact hole 102C. This falls into increasing the wiring area between the circuit blocks 10 and 11 and also changing the wiring area between the circuit block 10 or 11 and other circuit blocks not shown, causing the rewiring. In order to avoid this problem, a manual connection must be carried out between the blocks in the layout state shown in FIG. 12, but it requires much longer time in design.

In addition, in a case where the terminals 102 and 112 and the inter-block wire 12 belong to a same net as shown in FIG. 14, if the terminal 112 and the inter-block wire 12 are first connected to each other through the wire 112L, a contact hole 112C is formed in the same size as the width of the terminal 112. Therefore, when the terminal 102 and the contact hole 112C are connected to each other through the wire 102L, the wire resistance is increased due to the insufficient area of the contact hole 112C, which causes increase in the signal delay and timing error. In a case where the wire is used for supplying the power supply, the increased wire resistance lowers the supplied voltage and the electromigration tolerance, resulting in reducing the reliance of the integration circuit.

In order to avoid these problems, a method can be considered as shown in FIG. 15 where the area between the circuit blocks 10 and 11 is secured in advance two times as that in the case shown in FIG. 12; additional inter-block wires 12A and 13A are disposed parallel to the inter-block wires 12 and 13; the inter-block wires 12A and 13A are connected to the inter-block wires 12 and 13, respectively; the inter-block wires 12 and 13 are used for connection with the terminals of the circuit block 10; and the inter-block wires 12A and 13A are used for connection with the terminals of the circuit block 11. However, this method leads to increase in the inter-block area.

SUMMARY OF THE INVENTION

Accordingly, it is an object of the present invention to provide a method and an apparatus for automatic wiring design between block circuits of an integrated circuit and a program for performing the same method, which gives priority order to wring so as to reduce manual processes by decreasing the number of not-connected wires as a result of the automatic wiring process, and also reduce the wiring area required to form the inter-block wiring.

In one aspect of the present invention, there is provided a method for automatic wiring design between block circuits of an integrated circuit, which performs an automatic connection between an inter-block wire disposed between a first circuit block and a second circuit block, and terminals formed along sides of the first and second blocks, the sides facing each other, the method comprising the steps of:

(a) sorting the terminals according to the width thereof; and (b) selecting a terminal from the terminals in descending order of the width, and connecting between the selected terminal and an inter-block wire belonging to a same net as the terminal.

According to this method, the connection is made for the block terminals in descending order of the width thereof, and therefore the length of extended wire from larger width terminals becomes shorter, which allows reducing the inter-block wiring area. In addition, because forming the contact hole is also performed in descending order of the width thereof, it can be avoided that a larger width wire is connected to a smaller width contact hole.

In another aspect of the present invention, the method for automatic wiring design between block circuits of an integrated circuit comprises the steps of:

(a) sorting the terminals, connected to a power supply wire, according to the value of electric current passing through the terminals; and (b) selecting a terminal from the terminals in descending order of the value of electric current and connecting between the selected terminal and an inter-block wire belonging to a same net as the selected terminal.

According to this method, the connection is made for the terminal having larger current value, earlier than the terminal having smaller current value even though they have the same width. This allows the length of a wire, which connects between the terminal having larger current value and the inter-block wire, to be shorter than a wire which connects between the terminal having smaller current value and the inter-block wire. Therefore the whole electromigration tolerance of an integrated circuit is improved compared with a case where the connection is made in inverse order. Further, this can prevent the voltage reduction due to the wire resistance.

BRIEF DESCRIPTION OF THE DRAWINGS

FIG. 4 is a view for illustrating step S6 shown in FIG. 2.

DESCRIPTION OF THE PREFERRED EMBODIMENTS

Figure 1:
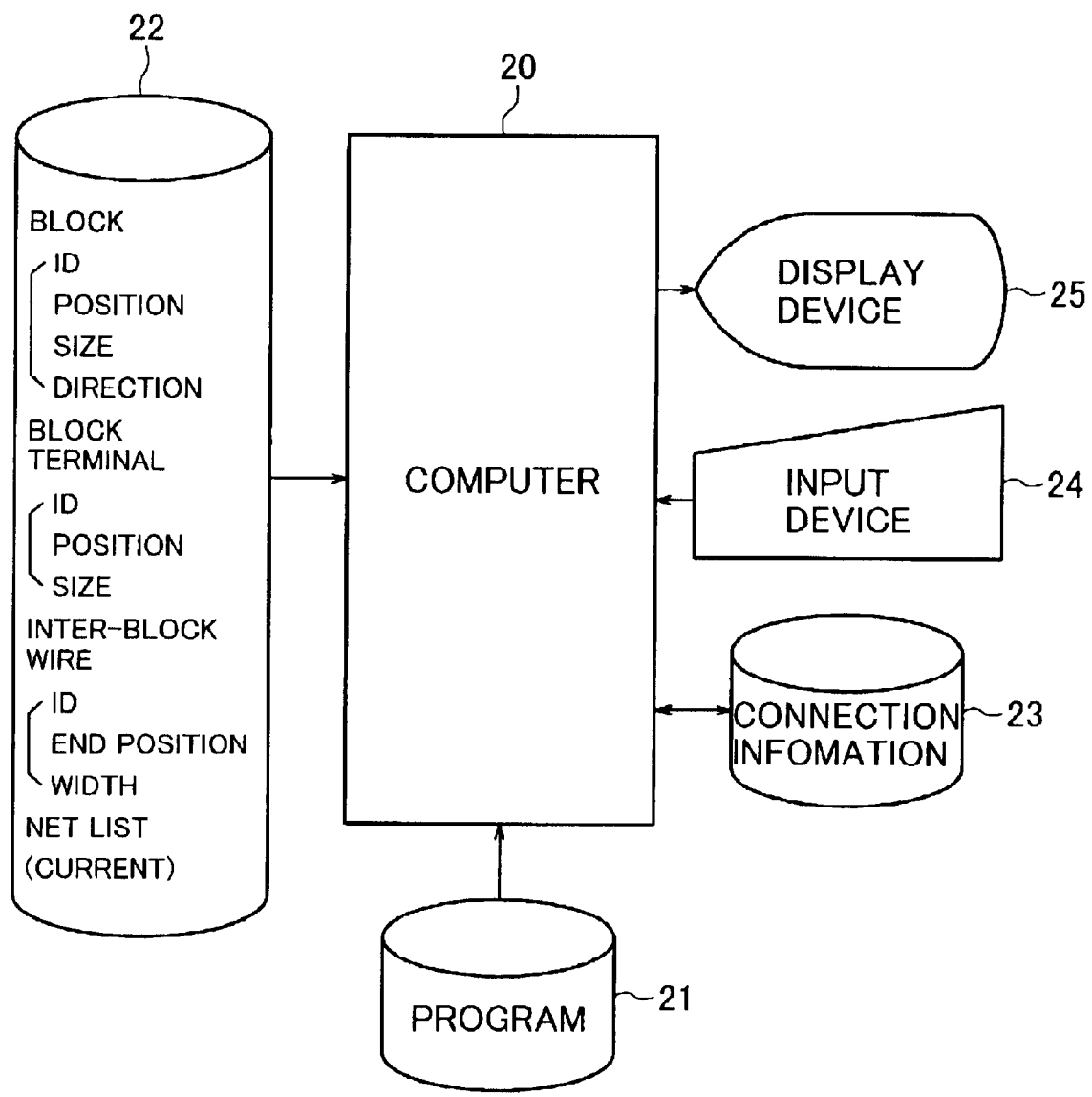
FIG. 1 is a schematic block diagram showing the hardware configuration of the apparatus for automatic wiring design between block circuits of an integrated circuit according to a first embodiment of the present invention.

Hereinafter, the present invention will be described in more detail referring to the drawings.

First Embodiment

FIG. 1 is a schematic block diagram showing the hardware configuration of the apparatus for automatic wiring design between block circuits of an integrated circuit according to a first embodiment of the present invention.

The apparatus of this embodiment is a computer system which comprises, as shown in FIG. 1, a computer 20, and storages 21~23, an input device 24 and a display device 25, each coupled to the computer 20. The computer 20 loads a program stored in the storage 21 into a main storage, in response to a starting command from the input device 24. According to the program, the computer 20 reads wiring data from the storage 22; automatically performs inter-block connection; stores result of the automatic connection in the storage 23; and displays the contents of log file, including the achievement ratio of automatic wiring, not-connected information and the like, on the display device 25.

Figure 3:
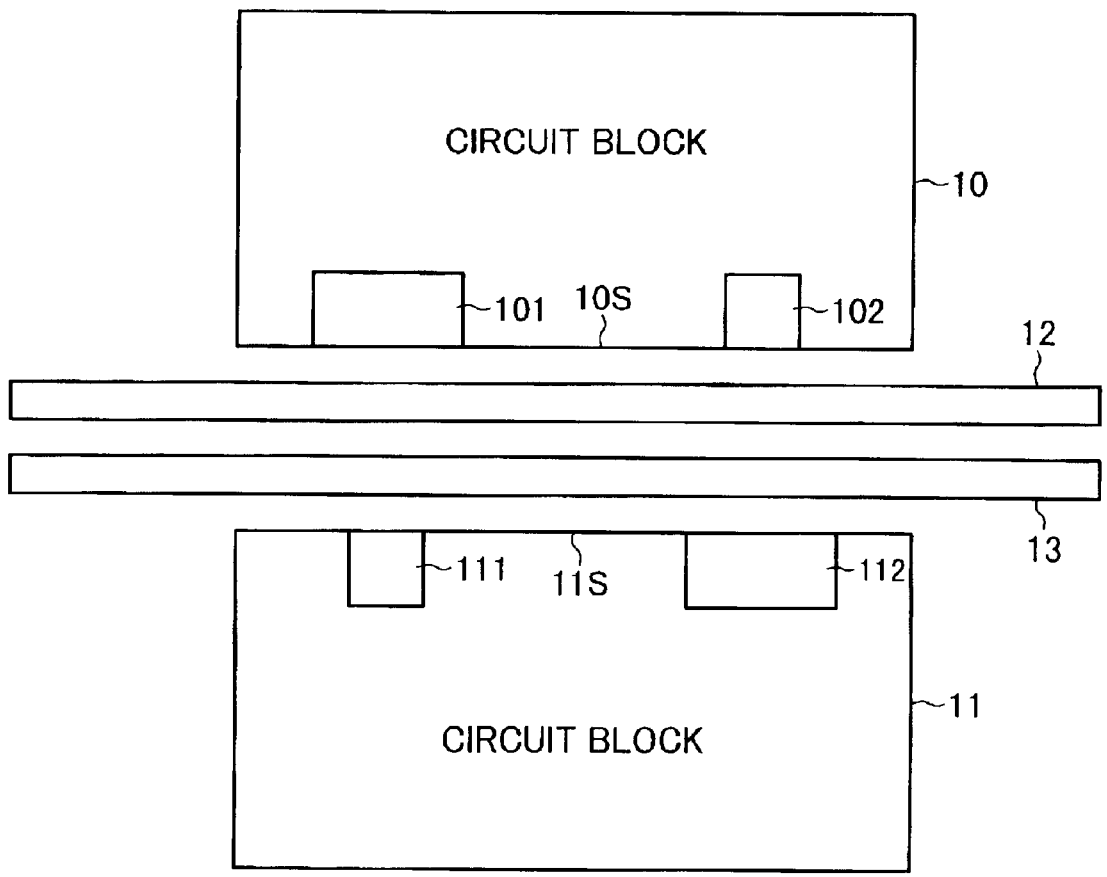
FIG. 3 is a view showing a layout before performing the inter-block connection, which is used for illustrating the data stored in the storage 22 shown in FIG. 1.

FIG. 3 is a view for illustrating the data stored in the storage 22 shown in FIG. 1, where inter-block wires 12 and 13 are disposed between circuit blocks 10 and 11, terminals 101 and 102 are formed along a side 10S of the circuit block 10 which faces the circuit block 11, and terminals 111 and 112 are formed along a side 11S of the circuit block 11 which faces the circuit block 10.

The storage 22 stores, as wiring data, frame data of the circuit blocks 10 and 11, data of terminals 101 and 102 in the circuit block 10 and terminals 111 and 112 in the circuit block 11, data of inter-block wires 12 and 13, and net-list for inter-block connection. The data of the block frame and the block terminal is a cell data registered in a cell library, where the data of the block frame includes the identification code, the position, the size and the direction thereof, the data of the block terminal includes the identification code and the position and the size thereof. The direction of the block corresponds to an angle between the direction of its cell in the cell library and the altered direction after it is disposed in the design surface. The data of the inter-block wire includes the identification code, the end position, and the width thereof.

Figure 2:
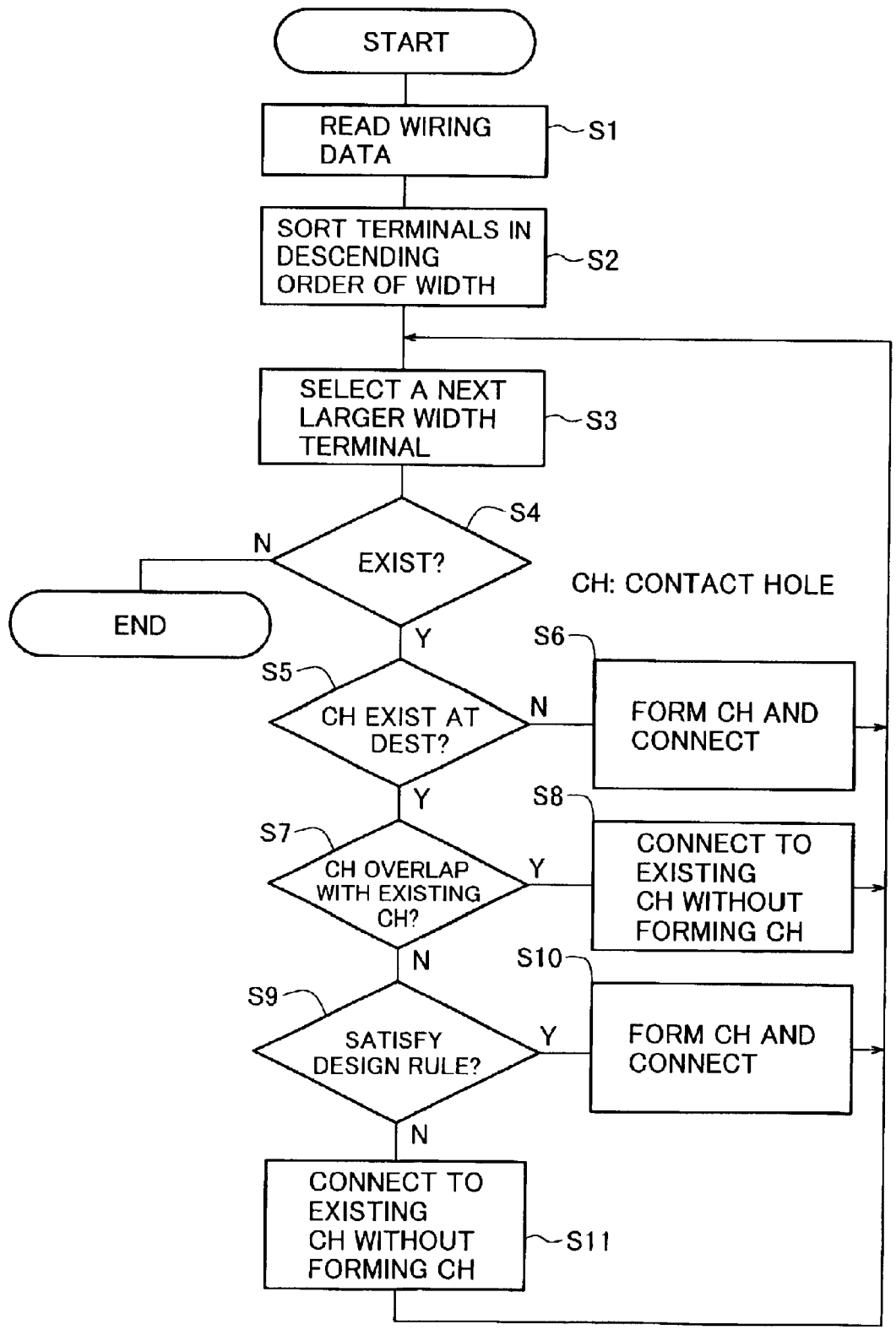
FIG. 2 is a schematic flow chart of part of the program stored in the storage shown in FIG. 1.

FIG. 2 is a schematic flow chart of part of the program stored in the storage 21 shown in FIG. 1. The following parenthesized reference numerals refer to steps shown in FIG. 2.

(S1) The wiring data is read out of the storage 22.

(S2) Terminals formed along sides of blocks facing each other are sorted in descending order of the width (largest width first). For example, in a case of FIG. 3, terminals 101, 112, 102 and 111 are sorted in the mentioned order.

(S3) A next larger width terminal is selected. In the beginning, a terminal having the largest width is selected.

(S4) If there is no terminal to be selected in step S3, the procedure is finished, and if not, it moves to step S5.

(S5) If there is no contact hole already formed on an inter-block wire belonging to the same net as the terminal selected in step S3, the procedure moves to step S6, and if not, it moves to step S7.

(S6) A wire having the same width as the terminal selected in step S3 is extended from the selected terminal, with the shortest extended route satisfying the design rule and is connected to the inter-block wire belonging to the same net. For example, in a case shown in FIG. 4 where a terminal 101 and an inter-block wire 12 belong to the same net and there is no contact hole formed on the inter-block wire 12, a wire 101L is extended from the terminal 101 in the direction perpendicular to a side 10S; a contact hole 101C is formed at the cross portion between the wire 101L and the inter-block wire 12; and the wire 101L is connected to the contact hole 101C. The inter-block wire 12 belongs to lower or upper wire layers with respect to the wire 101L and is connected to the wire 101L through the contact hole 101C. Thereafter, the procedure returns to step S3.

Figure 5:
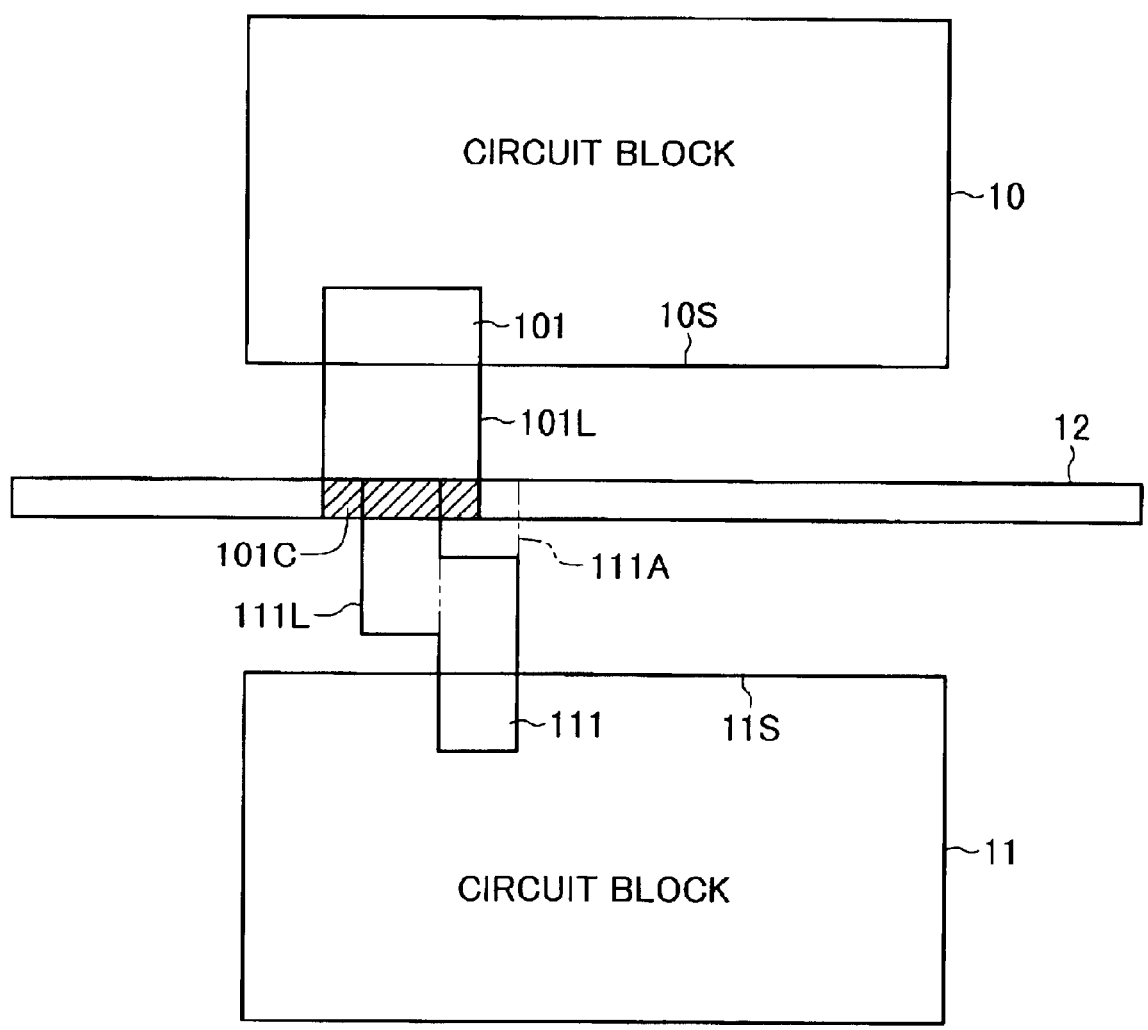
FIG. 5 is a view for illustrating step S8 shown in FIG. 2.

(S7) when it is assumed that a wire having the same width as the terminal selected in step S3 is extended from the selected terminal, with the shortest extended route satisfying the design rule and is connected to the inter-block wire belonging to the same net, if the cross portion between the extended wire and the inter-block wire, that is, the contact hole to be formed is overlapped with the already-formed contact hole, the procedure moves to step S8, and if not, it moves to step S9. For instance, in a case shown in FIG. 5 where the terminal 101 has already been connected to the inter-block wire 12, and a contact hole 101C has been formed between the wire 101L and the inter-block wire 12, when a wire 111A is virtually extended from the terminal 111 in the direction perpendicular to the side 11S, the cross portion with the inter-block wire 12 is overlapped with an already-formed contact hole 101C, and therefore the procedure moves to step S8.

(S8) Without forming a contact hole, the terminal selected in step S3 is connected to the contact hole overlapped therewith. For instance, in a case shown in FIG. 5, the terminal 111 is connected to the already-formed contact hole 101C through a bent wire 111L. Thereafter, the procedure returns to step S3.

(S9) In a case where a space width between the wire extended in step S7 and the wire which belongs to the same net as the extended wire and has been connected to the already-formed contact hole satisfies the design rule, the procedure moves to step S10, and if not, it moves to step S11. For instance, as shown in FIG. 6, the branch or cross of destination is determined based on whether the design rule is satisfied by the space width SL between the wire 111L extended from the terminal 111 and the wire 101L connected to the already-formed contact hole 101C.

Figure 6:
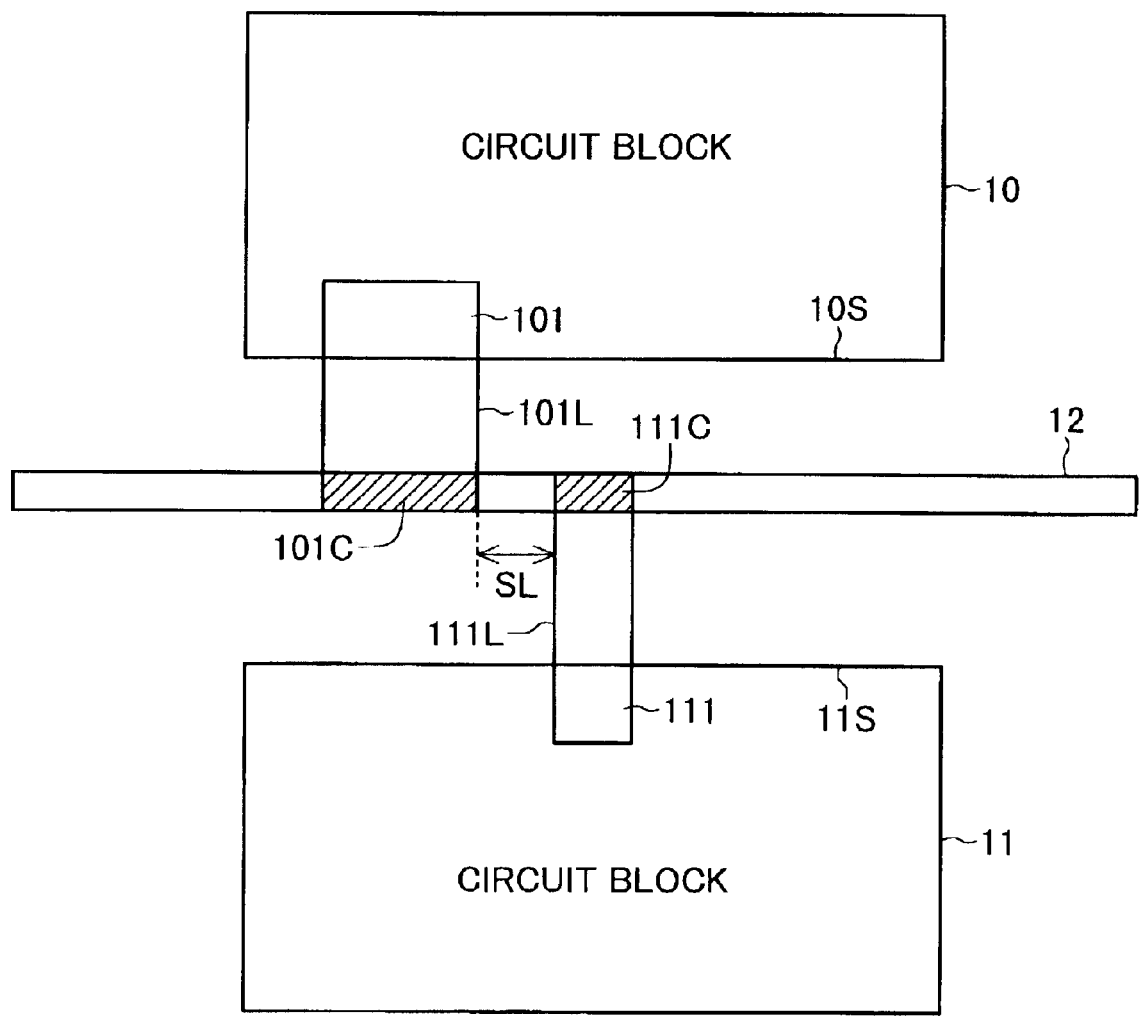
FIG. 6 is a view for illustrating step S10 shown in FIG. 2.

(S10) In the case shown in FIG. 6, a contact hole 111C is formed at the cross portion between the inter-block wire 12 and the wire 111L extended in step S7, and the terminal 111 is connected to the contact hole 111C through the wire 111L. Thereafter, the procedure returns to step S3.

Figure 7:
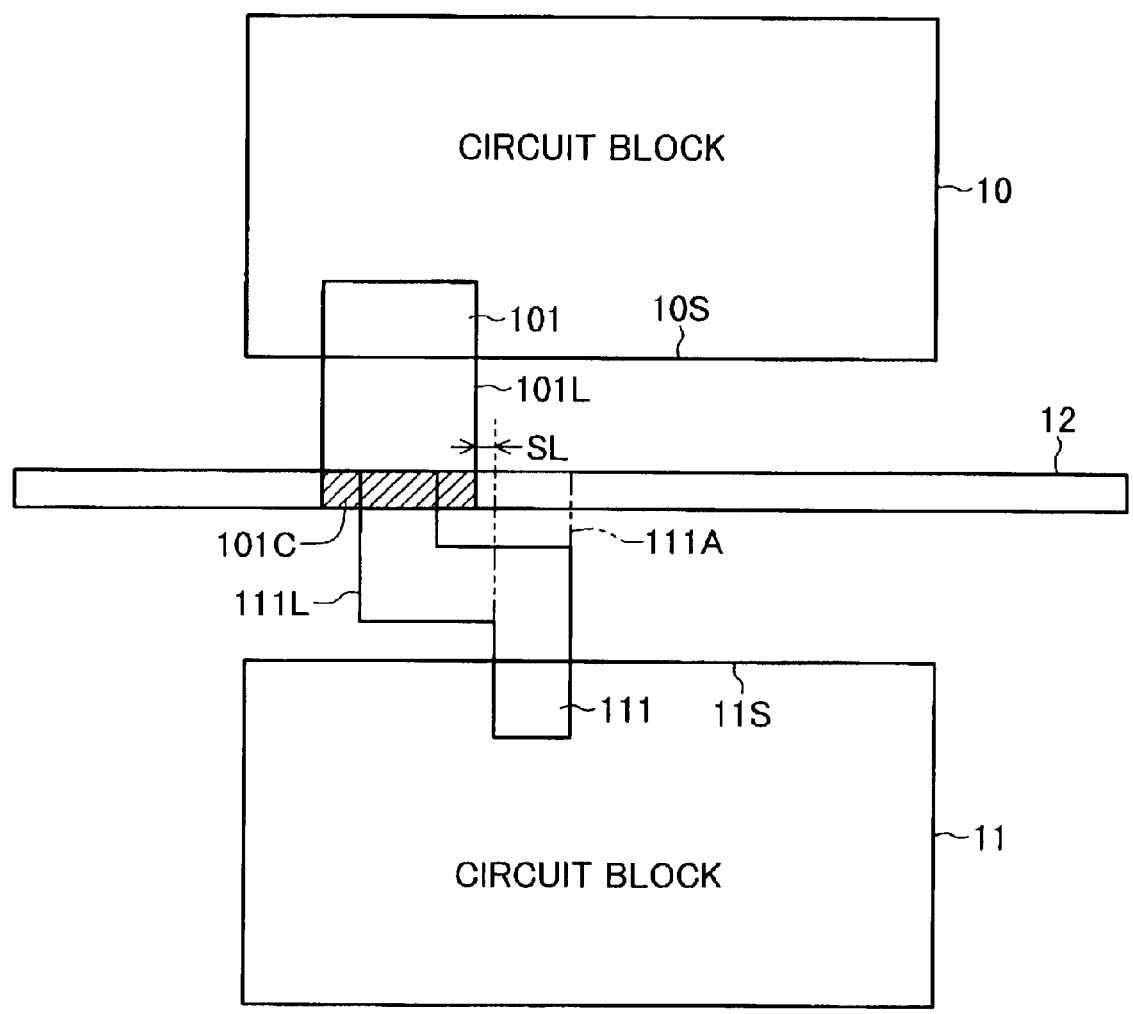
FIG. 7 is a view for illustrating step S11 shown in FIG. 2.

(S11) In a case as shown in FIG. 7 where the space width SL between the wire 111A extended in step S7 and the already-formed wire 101L does not satisfy the design rule, the terminal 111 is connected to the contact hole 101C through a bent wire 111L, without forming a new contact hole. Thereafter, the procedure returns to step S3.

Figure 8:
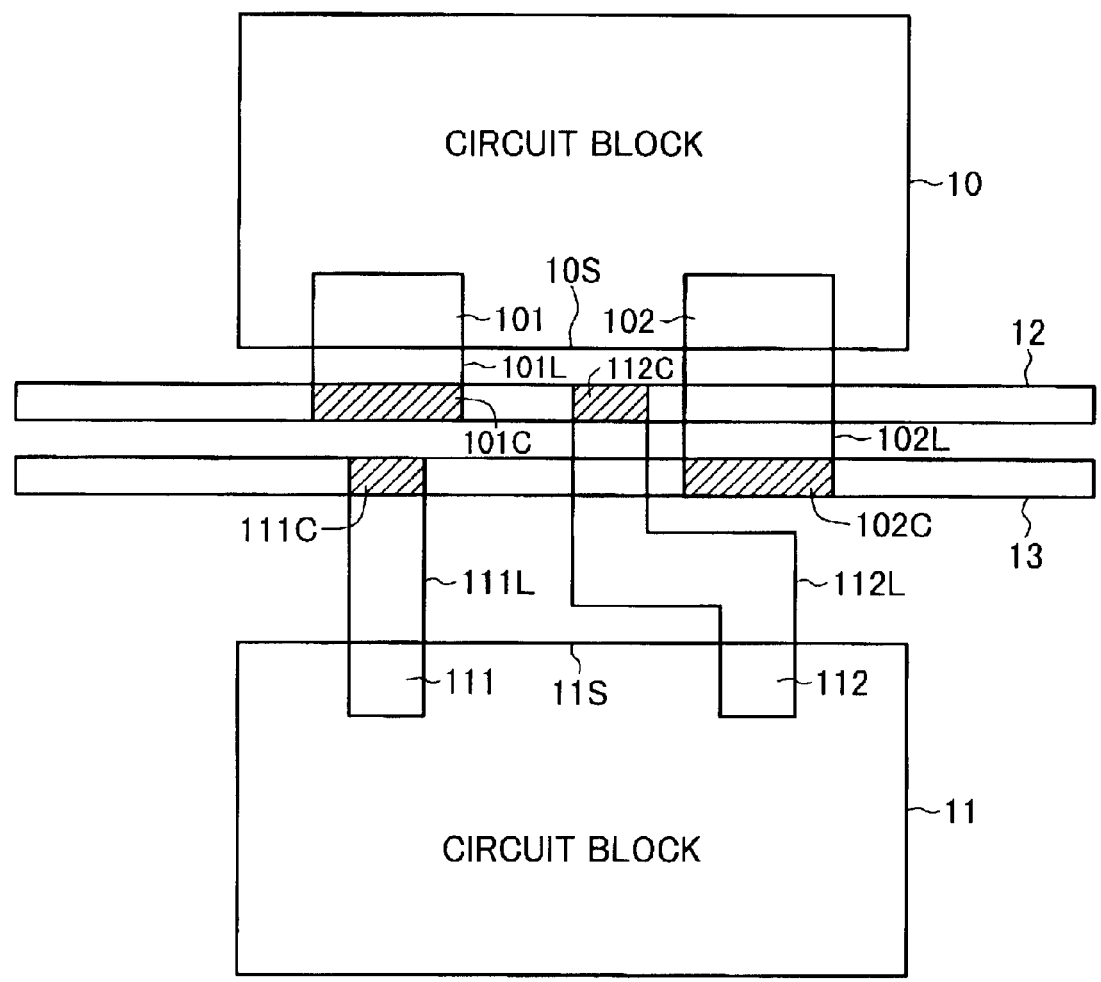
FIG. 8 is a layout view showing a case where the automatic connection is made by the method shown in FIG. 2.
Figure 9:
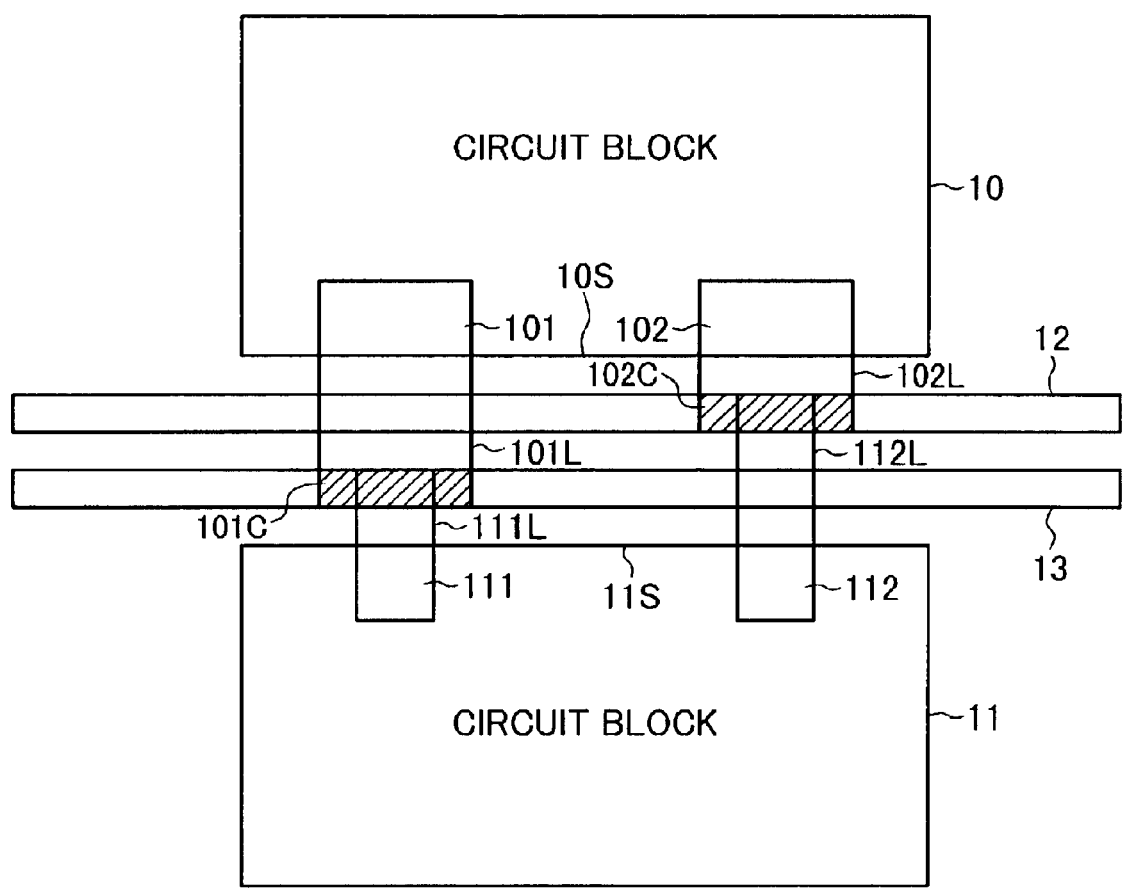
FIG. 9 is a layout view showing another case where the automatic connection is made by the method shown in FIG. 2.

FIGS. 8 and 9 show examples where the automatic connection is performed by the method shown in FIG. 2.

FIG. 8 shows a case where terminals 102 and 111 and an inter-block wire 13 belong to one same net, and terminals 101 and 112 and an inter-block wire 12 belong to another same net. As shown in this figure, the terminals 101 and 102 have widths larger than the terminals 111 and 112, and therefore after connection between the terminals 101 and 102 is performed in step S6 shown in FIG. 2, connection between the terminals 111 and 112 is performed in step S10 shown in FIG. 2.

Figure 13:
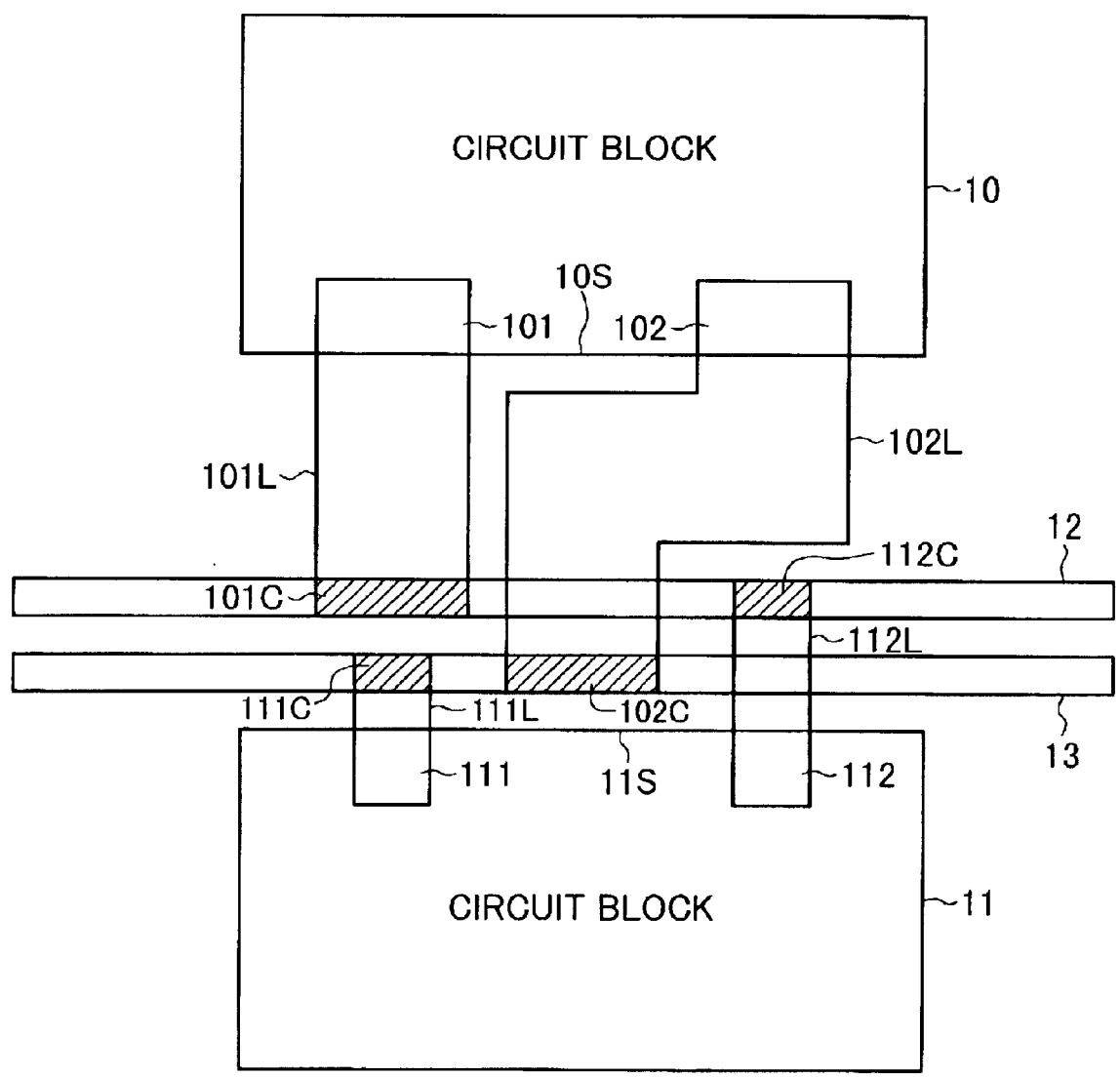
FIG. 13 is a view for illustrating a problem in a conventional method where automatic connection and correction is made for the layout state shown in FIG. 12.

This method allows reducing the wiring region between the circuit blocks 10 and 11, compared with the conventional case shown in FIG. 13.

FIG. 9 shows a case where terminals 101 and 111 and an inter-block wire 13 belong to one same net, and terminals 102 and 112 and an inter-block wire 12 belong to another same net. As shown in this figure, the terminals 101 and 102 have width larger than the terminals 111 and 112, and therefore after the connection processes for the terminals 101 and 102 are performed in step S6 shown in FIG. 2, the connection processes for the terminals 111 and 112 are performed in step S8 shown in FIG. 2.

Figure 14:
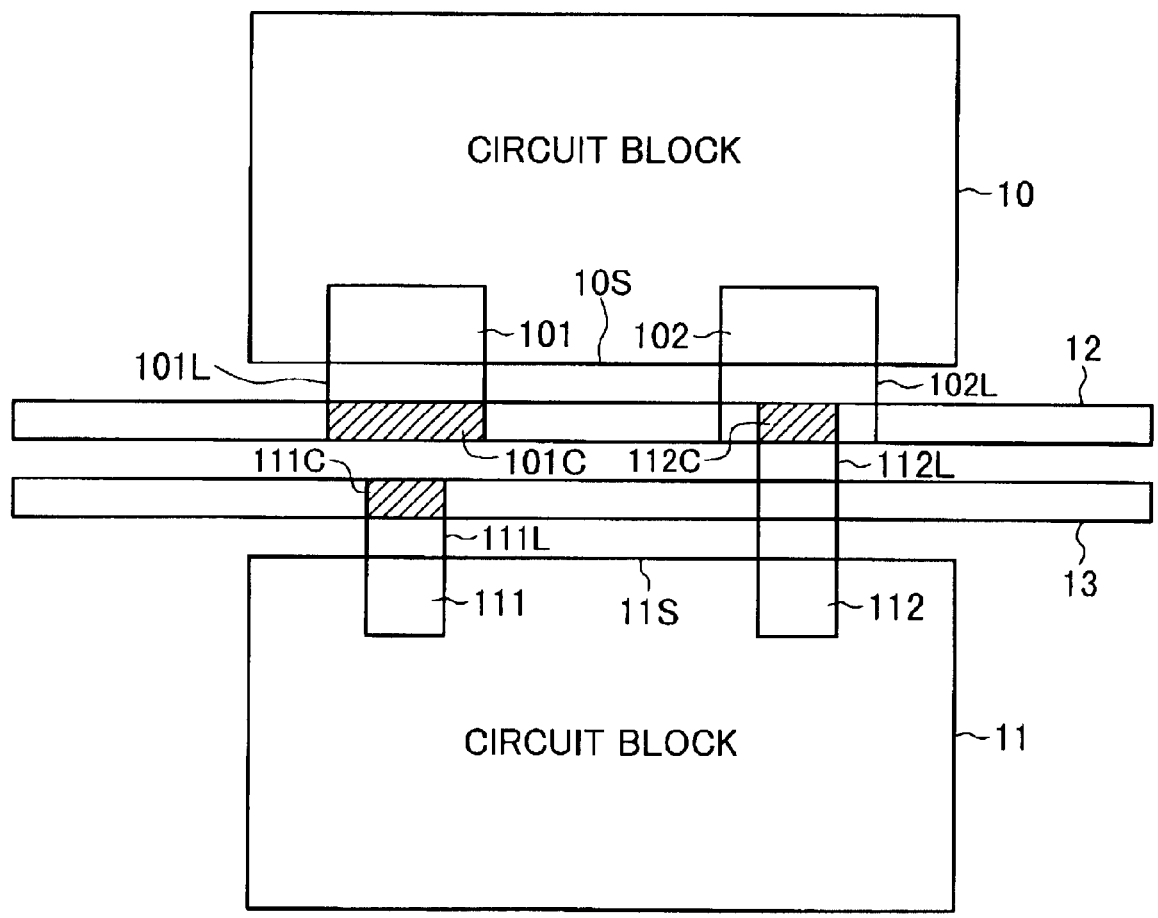
FIG. 14 is a view for illustrating another problem in a conventional method for automatic wiring design between block circuits of an integrated circuit.
Figure 15:
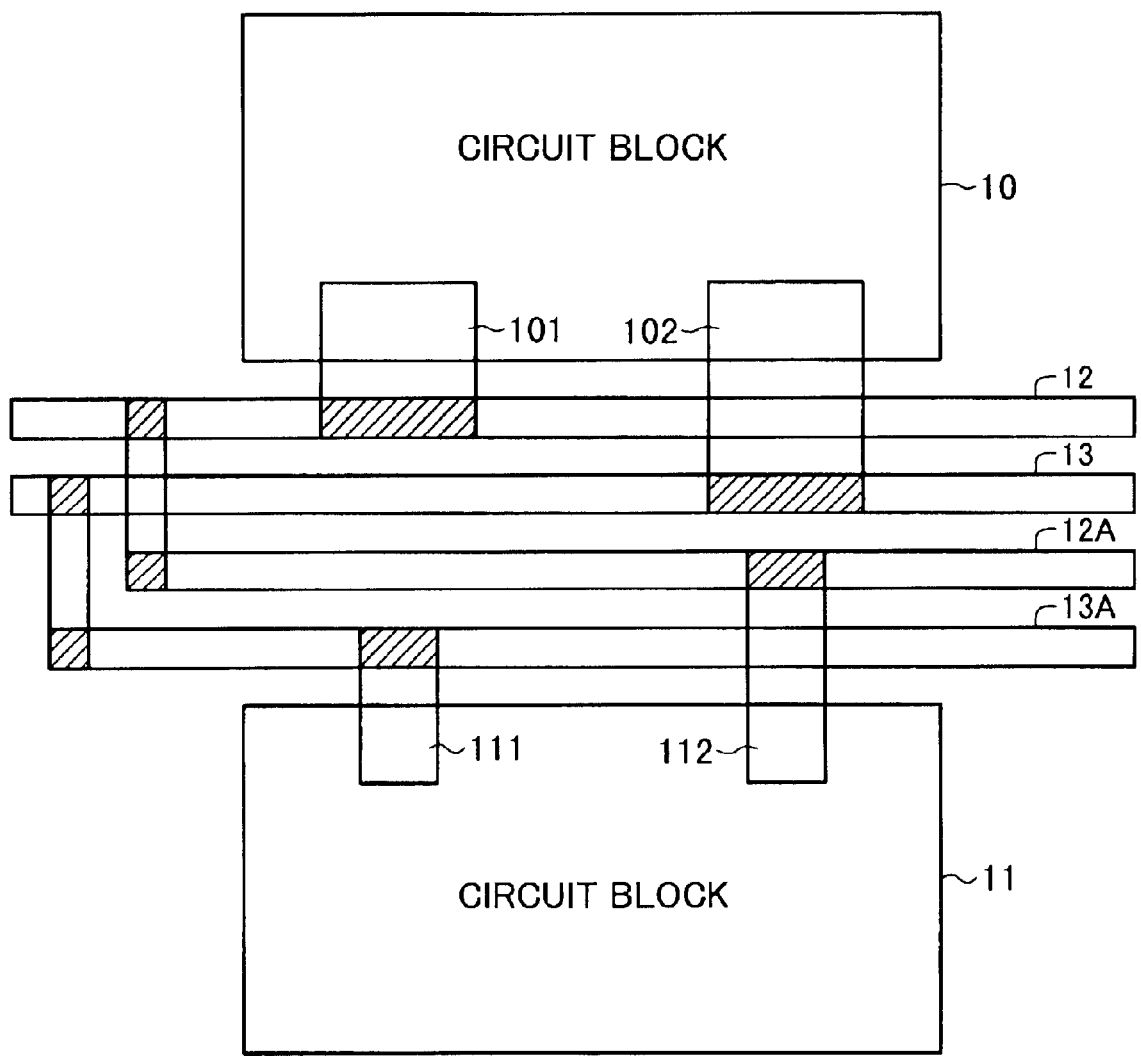
FIG. 15 is a view for illustrating still another problem in a conventional method for automatic wiring design between block circuits of an integrated circuit.

This method prevents forming of the contact hole 112C having a narrow width as shown in FIG. 14.

Second Embodiment

Figure 10:
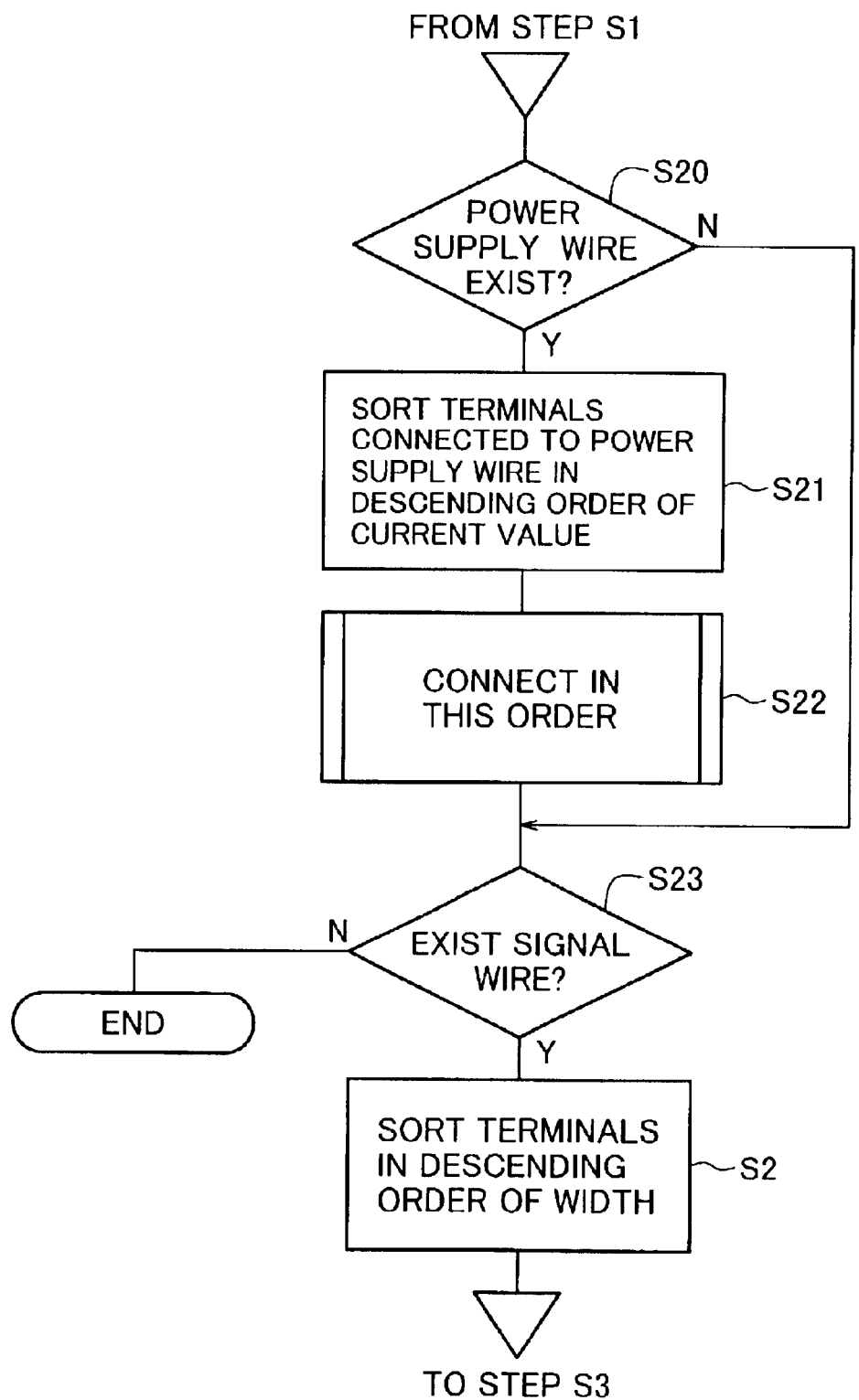
FIG. 10 is a schematic flow chart for partly showing the method for automatic wiring design between the circuit blocks of an integrated circuit according to a second embodiment of the present invention.

A method for automatic wiring design between block circuits of an integrated circuit according to the second embodiment of the present invention employs a procedure shown in FIG. 10 instead of step S2 shown in FIG. 2.

(S20) When there is a block terminal connected to a power supply wire, the procedure moves to step S21, and if not, it moves to step S23.

(S21) Calculation has been made in advance for obtaining the value (time average or maximum value) of electric current flowing through each block terminal connected to the power supply wire, and the storage 22 shown in FIG. 1 has stored the obtained current value. The terminals connected to the power supply wire are sorted in descending order of the current value.

(S22) The same repeated procedure as the steps S3~S11 shown in FIG. 2 is performed for the terminals connected to the power supply wire. However, differently from the first embodiment, a terminal having next larger current value is selected in step S3 shown in FIG. 2.

(S23) If there is a block terminal connected to a signal wire, the procedure moves to step S2, which is the same as step S2 shown in FIG. 2, and if not, the procedure is finished.

Figure 11:
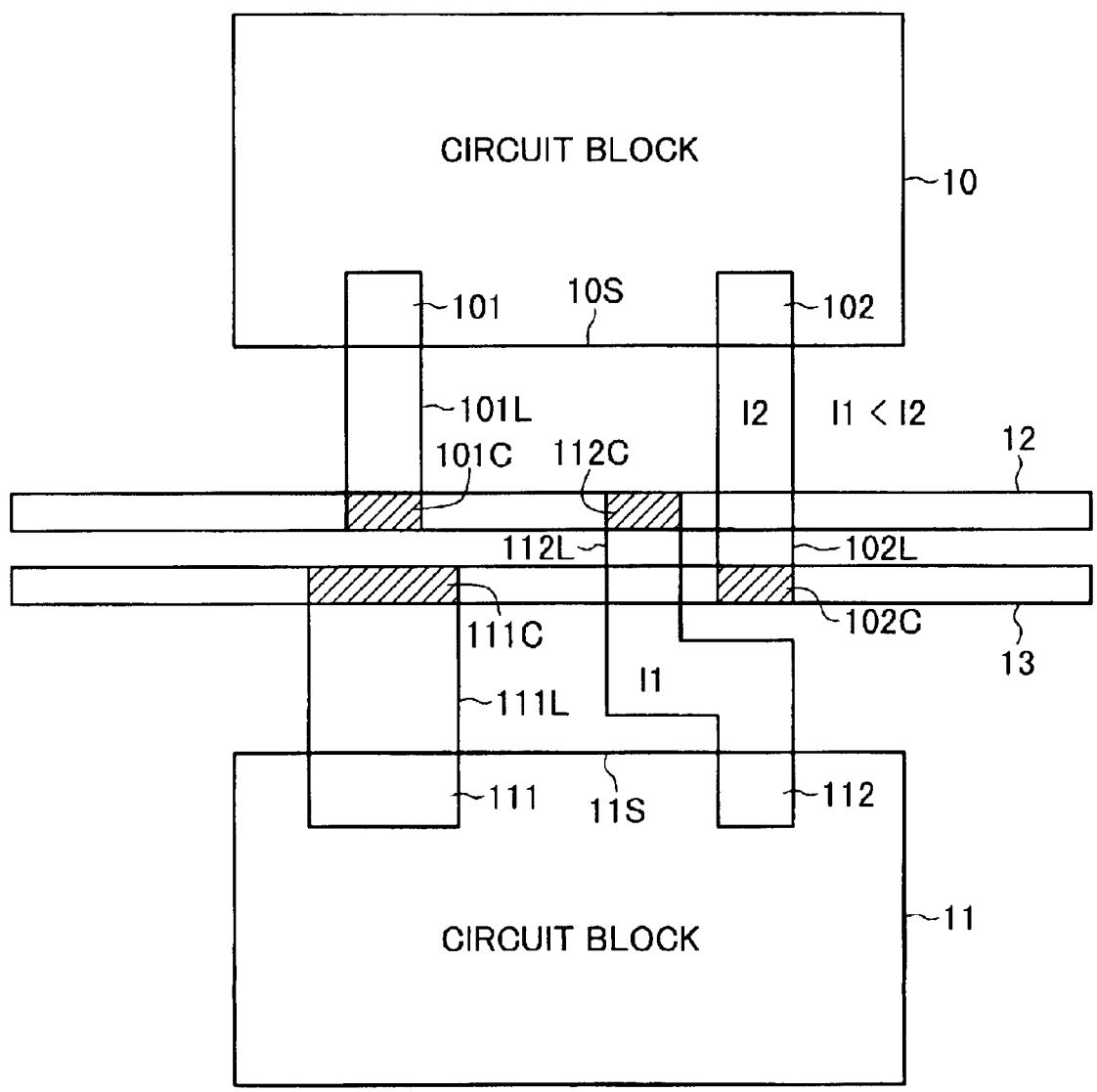
FIG. 11 is a layout view showing a case where the automatic connection is made by the method shown in FIG. 10.
Figure 12:
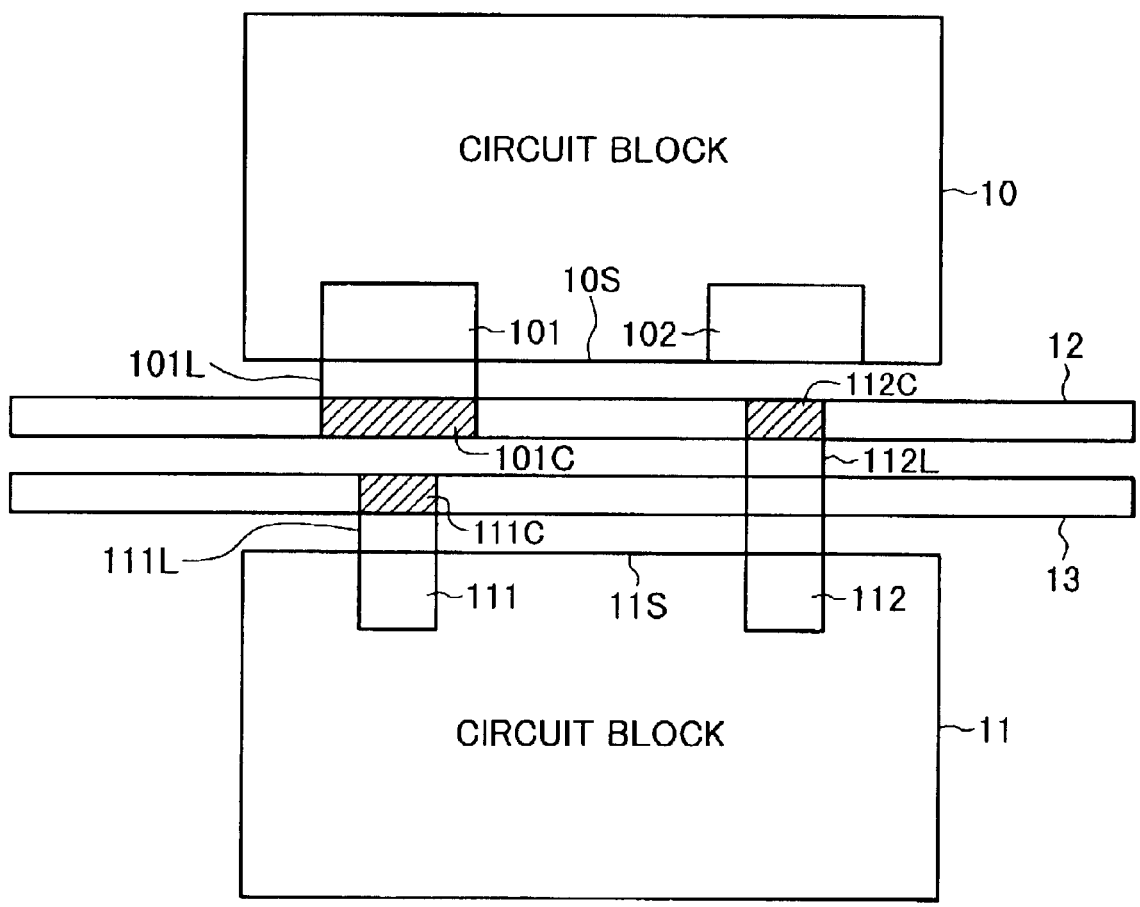
FIG. 12 is a view for illustrating a problem in a conventional method for automatic wiring design between block circuits of an integrated circuit.

FIG. 11 shows an example where the automatic connection is performed by the method shown in FIG. 10.

FIG. 11 shows a case where inter-block wires 12 and 13 are power supply wires; terminals 101 and 112 and an inter-block wire 12 belong to one same net, and terminals 102 and 111 and an inter-block wire 13 belong to another same net. The terminals 111, 102, 101 and 112 are in descending order of the current value, and their connection processes are performed in the order.

According to this method, the connection is made for the terminal 102 having larger current value I2, earlier than the terminal 112 having smaller current value I1 even though they have the same width, which allows the power supply wire to be shortened in length, so that the whole electromigration tolerance of an integrated circuit is improved compared with a case where the connection is made in inverse order.

In addition, the number of inter-block wires is only required to be more than one, and also the number of terminals formed along the block sides facing each other is only required to be more than one. Further, the circuit block may be anyone of a cell, a macro cell, or a hard macro, or the like. Furthermore, a method may be employed where calculation is made for obtaining the current value (time average or maximum value) of the signal terminal, and the connection is made in descending order of the current value for the signal terminals having the same width. This method also improves the electromigration tolerance.

The forgoing embodiments are merely exemplary and are not to be construed as limiting the present invention. The present teachings can be readily applied to other types of apparatuses or methods. The description of the present invention is intended to be illustrative, and not to limit the scope of the claims. Many alternatives, modifications, and variations will be apparent to those skilled in the art.

What is claimed is:

1. A method for automatic wiring design between block circuits of an integrated circuit, which performs an automatic connection between an inter-block wire disposed between a first circuit block and a second circuit block, and terminals formed along sides of the first and second blocks, the sides facing each other, the method comprising the steps of:

(a) sorting the terminals according to the width thereof; and
  (b) selecting a terminal from the terminals in descending order of the width, and connecting between the selected terminal and an inter-block wire belonging to a same net as the terminal.

2. The method according to claims 1, wherein the step (b) comprises the steps of:

(b1) judging whether or not there is an inter-block contact hole already formed on a first inter-block wire belonging to a same net as the selected terminal; and
  (b2) forming a first inter-block contact hole on the first inter-block wire, and connecting between the selected terminal and the first inter-block contact hole, provided that the judgment result of the step (b1) is negative.

3. The method according to claim 2, wherein the step (b) further comprises the steps of:

(b3) judging whether or not a second inter-block contact hole, already formed on the first inter-block wire, is overlapped with a connecting portion between the first inter-block wire and a virtually extended wire, which has a same width as the selected terminal and is extended from the selected terminal to be connected to the first inter-block wire with a shortest extended distance, provided that the judgment result of the step (b1) is positive; and
  (b4) connecting between the selected terminal and the second inter-block contact hole, provided that the judgment result of the step (b3) is positive.

4. The method according to claim 3, wherein the step (b) further comprises the steps of:

(b5) judging whether or not a distance between the virtually extended wire connected to the connecting portion and a wire connected to the second inter-block contact hole satisfies a design rule, provided that the judgment result of the step (b3) is negative; and
  (b6) forming a third inter-block contact hole on the connecting portion and connecting between the selected terminal and the third inter-block contact hole, provided that the judgment result of the step (b5) is positive.

5. The method according to claim 4, wherein the step (b) further comprises the step of:

(b7) connecting between the selected terminal and the second inter-block contact hole, provided that the judgment result of the step (b5) is negative.

6. A method for automatic wiring design between block circuits of an integrated circuit, which performs an automatic connection between an inter-block wire disposed between a first circuit block and a second circuit block, and terminals formed along sides of the first and second blocks, the sides facing each other, the method comprising the steps of:

(a) sorting the terminals, connected to a power supply wire, according to the value of electric current passing through the terminals; and
  (b) selecting a terminal from the terminals in descending order of the value of electric current and connecting between the selected terminal and an inter-block wire belonging to a same net as the selected terminal.

7. A computer performing an automatic wiring design between block circuits of an integrated circuit by performing an automatic connection between an inter-block wire disposed between a first circuit block and a second circuit block, and terminals formed along sides of the first and second blocks, the sides facing each other, the computer comprising:

a processor programmed to control the computer according to a process comprising:
    sorting the terminals according to the width thereof; and
    selecting a terminal from the terminals in descending order of the width, and connecting between the selected terminal and an inter-block wire belonging to a same net as the terminal.

8. A computer program for an automatic wiring design between block circuits of an integrated circuit, whereby a computer performs an automatic connection between an inter-block wire disposed between a first circuit block and a second circuit block, and terminals formed along sides of the first and second blocks, the sides facing each other, wherein the computer program enables the computer to perform the steps of:

(a) sorting the terminals, connected to a power supply wire, according to the value of electric current passing through the terminals; and
  (b) selecting a terminal from the terminals in descending order of the value of electric current and connecting between the selected terminal and an inter-block wire belonging to a same net as the selected terminal.

9. A computer-readable recording medium on which a computer program for an automatic wiring design between block circuits of an integrated circuit is stored, whereby a computer performs an automatic connection between an inter-block wire disposed between a first circuit block and a second circuit block, and terminals formed along sides of the first and second blocks, the sides facing each other, wherein the computer program enables the computer to perform the steps of:

(a) sorting the terminals according to the width thereof; and (b) selecting a terminal from the terminals in descending order of the width, and connecting between the selected terminal and an inter-block wire belonging to a same net as the terminal.

10. An apparatus for automatic wiring design between block circuits of an integrated circuit, wherein a computer performs an automatic connection between an inter-block wire disposed between a first circuit block and a second circuit block, and terminals formed along sides of the first and second blocks, the sides facing each other, the apparatus comprising:

a computer; and a computer-readable recording medium where a program is installed that enables the computer to perform the steps of:

(a) sorting the terminals according to the width thereof; and (b) selecting a terminal from the terminals in descending order of the width, and connecting between the selected terminal and an inter-block wire belonging to a same net as the terminal.

11. An apparatus for automatic wiring design between block circuits of an integrated circuit, wherein a computer performs an automatic connection between an inter-block wire disposed between a first circuit block and a second circuit block, and terminals formed along sides of the first and second blocks, the sides facing each other, the apparatus comprising:

a computer; and a computer-readable recording medium where a program is installed that enables the computer to perform the steps of:

(a) sorting the terminals, connected to a power supply wire, according to the value of electric current passing through the terminals; and (b) selecting a terminal from the terminals in descending order of the value of electric current and connecting between the selected terminal and an inter-block wire belonging to a same net as the selected terminal.

* * * * *